(12) United States Patent
Konishi et al.

(10) Patent No.: US 12,107,176 B2
(45) Date of Patent: Oct. 1, 2024

(54) SOLAR CELL AND METHOD FOR MANUFACTURING SOLAR CELL

(71) Applicant: KANEKA CORPORATION, Osaka (JP)

(72) Inventors: Katsunori Konishi, Settsu (JP); Kunihiro Nakano, Settsu (JP)

(73) Assignee: KANEKA CORPORATION, Osaka (JP)

( * ) Notice: Subject to any disclaimer, the term of this patent is extended or adjusted under 35 U.S.C. 154(b) by 193 days.

(21) Appl. No.: 17/647,937

(22) Filed: Jan. 13, 2022

(65) Prior Publication Data

US 2022/0140162 A1 May 5, 2022

Related U.S. Application Data

(63) Continuation of application No. PCT/JP2020/027527, filed on Jul. 15, 2020.

(30) Foreign Application Priority Data

Jul. 16, 2019 (JP) .................................. 2019-131126

(51) Int. Cl.
*H01L 31/075* (2012.01)
*H01L 31/0224* (2006.01)
(Continued)

(52) U.S. Cl.
CPC ............... *H01L 31/022458* (2013.01); *H01L 31/02363* (2013.01); *H01L 31/075* (2013.01); *H01L 31/18* (2013.01)

(58) Field of Classification Search
CPC ....... H01L 31/022458; H01L 31/02363; H01L 31/075
See application file for complete search history.

(56) References Cited

U.S. PATENT DOCUMENTS

2010/0206375 A1\* 8/2010 Hsu .................. H01L 31/046
136/256
2011/0056545 A1 3/2011 Ji et al.
(Continued)

FOREIGN PATENT DOCUMENTS

JP 2005-101151 A 4/2005
WO 2014/136715 A1 9/2014
(Continued)

OTHER PUBLICATIONS

International Search Report issued in PCT/JP2020/027527; mailed Sep. 15, 2020.

*Primary Examiner* — Uyen M Tran
(74) *Attorney, Agent, or Firm* — Studebaker & Brackett PC

(57) ABSTRACT

A back-contact solar cell having a first conductivity-type semiconductor layer in a first region on a back side of a semiconductor substrate, and a second conductivity-type semiconductor layer in a second region and the first region on the back side. In the first region, an intrinsic semiconductor layer and the first and second conductivity-type semiconductor layers are stacked successively on the back side. In the second region, the intrinsic semiconductor layer and the second conductivity-type semiconductor layer are stacked on the back side. In a boundary region between the first and second regions, an insulating layer, and the first and second conductivity-type semiconductor layers, are stacked successively on the back side, with the intrinsic semiconductor layer disposed between the layers and the back side. The insulating layer is interposed between the first conductivity-type semiconductor layer in the first region and the second conductivity-type semiconductor layer in the second region.

4 Claims, 7 Drawing Sheets

(51) Int. Cl.
  *H01L 31/0236*  (2006.01)
  *H01L 31/18*  (2006.01)

(56) References Cited

U.S. PATENT DOCUMENTS

2015/0364624 A1* 12/2015 Kimoto ............... H01L 31/0747
  136/256
2015/0372172 A1  12/2015 Kimoto
2016/0268458 A1   9/2016 Kimoto et al.

FOREIGN PATENT DOCUMENTS

WO    2014/157521 A1   10/2014
WO    2015/060432 A1    4/2015

* cited by examiner

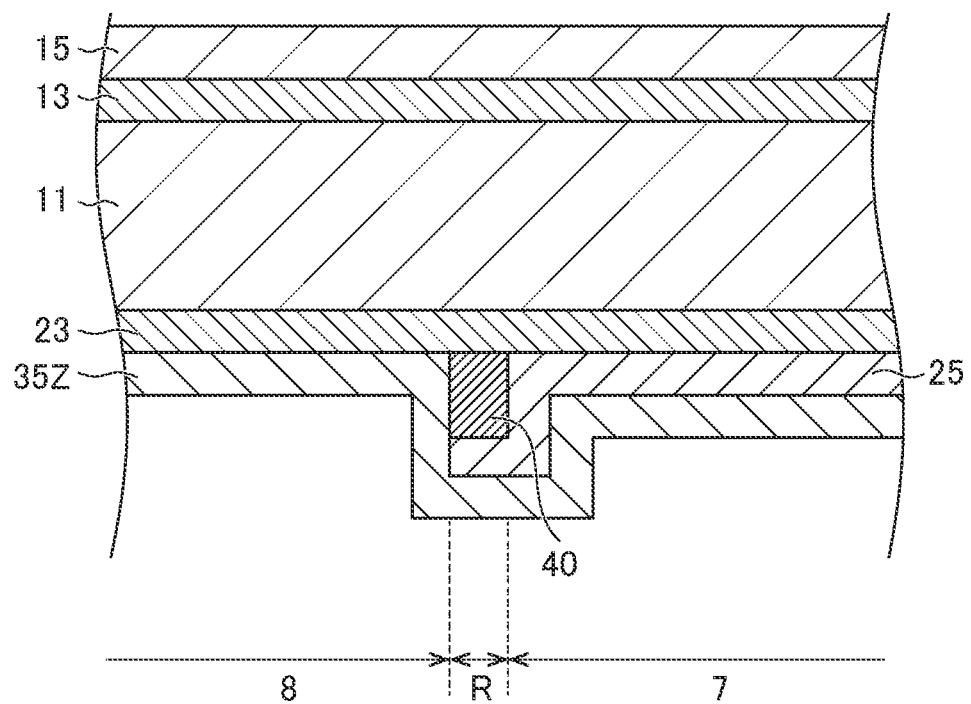

SOLAR CELL AND METHOD FOR MANUFACTURING SOLAR CELL

CROSS-REFERENCE TO RELATED APPLICATIONS

This application claims benefit of priority to International Patent Application No. PCT/JP2020/027527, filed Jul. 15, 2020, and to Japanese Patent Application No. 2019-131126, filed Jul. 16, 2019, the entire contents of each are incorporated herein by reference.

BACKGROUND

Technical Field

The present disclosure relates to a solar cell of back junction type (also referred to as back contact type or back electrode type) and a method for manufacturing a solar cell.

Background Art

Solar cells having semiconductor substrates include a solar cell of heterojunction type (hereinafter, referred to as double-sided junction type, as opposed to back junction type; also referred to as double-sided electrode type), in which semiconductor layers are formed both on a light receiving side and on a back side, and a solar cell of back junction type, in which semiconductor layers are formed only on a back side. In the case of the solar cell of double-sided junction type, electrodes are formed on the light receiving side, and therefore sunlight is blocked by the electrodes. By contrast, in the case of the solar cell of back junction type, no electrodes are formed on the light receiving side, and therefore the sunlight reception efficiency is high compared to the case of the solar cell of double-sided junction type. Japanese Unexamined Patent Application, Publication No. 2005-101151 discloses a solar cell of back junction type.

The solar cell disclosed in Japanese Unexamined Patent Application, Publication No. 2005-101151 includes a semiconductor substrate that functions as a photoelectric conversion layer; a first conductivity-type semiconductor layer provided in a first region, which is a portion of a back surface of the semiconductor substrate; and a second conductivity-type semiconductor layer provided on the first conductivity-type semiconductor layer in the first region and extending to a second region, which is another portion of the back surface of the semiconductor substrate. Such a solar cell can be manufactured by a simplified process, because the second conductivity-type semiconductor layer is simply formed over the entire back surface of the semiconductor substrate after patterning for the first conductivity-type semiconductor layer.

SUMMARY

However, the first conductivity-type semiconductor layer and the second conductivity-type semiconductor layer that are adjacent to each other are located in the vicinity of the back surface of the semiconductor substrate, and therefore the semiconductor substrate undergoes carrier recombination in an area in the vicinity of the boundary between the first conductivity-type semiconductor layer and the second conductivity-type semiconductor layer, resulting in performance degradation of the solar cell.

Accordingly, the present disclosure provides a solar cell and a method for manufacturing a solar cell that achieve reduction of such performance degradation.

The present disclosure is directed to a solar cell of back junction type including a semiconductor substrate having a main surface on one side and a main surface opposite thereto; a first conductivity-type semiconductor layer provided in a first region being a portion of the opposite main surface of the semiconductor substrate; and a second conductivity-type semiconductor layer provided on the first conductivity-type semiconductor layer in the first region and extending to a second region being another portion of the opposite main surface of the semiconductor substrate. The semiconductor substrate has an insulating layer and an intrinsic semiconductor layer on the opposite main surface. In the first region, the first conductivity-type semiconductor layer and the second conductivity-type semiconductor layer are stacked in order on the intrinsic semiconductor layer on the opposite main surface of the semiconductor substrate. In the second region, the second conductivity-type semiconductor layer is staked on the intrinsic semiconductor layer on the opposite main surface of the semiconductor substrate. In a boundary region between the first region and the second region, the insulating layer, the first conductivity-type semiconductor layer, and the second conductivity-type semiconductor layer are stacked in order on the intrinsic semiconductor layer on the opposite main surface of the semiconductor substrate. The intrinsic semiconductor layer is continuous across the first region, the boundary region, and the second region. The first conductivity-type semiconductor layer is continuous across the first region and the boundary region. The second conductivity-type semiconductor layer is continuous across the first region, the boundary region, and the second region. The insulating layer is located between a portion of the first conductivity-type semiconductor layer in the first region and a portion of the second conductivity-type semiconductor layer in the second region.

The present disclosure is also directed to a solar cell of back junction type including a semiconductor substrate having a main surface on one side and a main surface opposite thereto; a first conductivity-type semiconductor layer provided in a first region being a portion of the opposite main surface of the semiconductor substrate; and a second conductivity-type semiconductor layer provided in a second region being another portion of the opposite main surface of the semiconductor substrate. The semiconductor substrate has an insulating layer and an intrinsic semiconductor layer on the opposite main surface. In the first region, the first conductivity-type semiconductor layer is stacked on the intrinsic semiconductor layer on the opposite main surface of the semiconductor substrate. In the second region, the second conductivity-type semiconductor layer is staked on the intrinsic semiconductor layer on the opposite main surface of the semiconductor substrate. In a boundary region between the first region and the second region, the insulating layer and the first conductivity-type semiconductor layer are stacked in order on the intrinsic semiconductor layer on the opposite main surface of the semiconductor substrate. The intrinsic semiconductor layer is continuous across the first region, the boundary region, and the second region. The first conductivity-type semiconductor layer is continuous across the first region and the boundary region. The insulating layer is located between a portion of the first conductivity-type semiconductor layer in the first region and the second conductivity-type semiconductor layer in the second region.

The present disclosure is also directed to a method for manufacturing a solar cell of back junction type. The solar cell includes a semiconductor substrate having a main surface on one side and a main surface opposite thereto; a first conductivity-type semiconductor layer provided in a first region being a portion of the opposite main surface of the semiconductor substrate; and a second conductivity-type semiconductor layer provided on the first conductivity-type semiconductor layer in the first region and extending to a second region being another portion of the opposite main surface of the semiconductor substrate. The method includes an intrinsic semiconductor layer formation step comprising forming an intrinsic semiconductor layer in the first region, the second region, and a boundary region of the opposite main surface of the semiconductor substrate, the boundary region being located between the first region and the second region; and a lift-off layer formation step including forming an insulating lift-off layer on the intrinsic semiconductor layer, and then removing a portion of the lift-off layer in the first region through patterning using an etching solution, thereby leaving the lift-off layer in the second region and the boundary region. The method further includes a first semiconductor layer material film formation step including forming a first conductivity-type semiconductor layer material film on a portion of the intrinsic semiconductor layer in the first region and on the lift-off layer in the second region and the boundary region; a first semiconductor layer formation step including removing a portion of the lift-off layer in the second region and removing a portion of the first conductivity-type semiconductor layer material film in the second region while leaving the lift-off layer in the boundary region unremoved to form a patterned first conductivity-type semiconductor layer in the first region and the boundary region; and a second semiconductor layer formation step including forming the second conductivity-type semiconductor layer on the first conductivity-type semiconductor layer in the first region and the boundary region, and on a portion of the intrinsic semiconductor layer in the second region.

The present disclosure is also directed to a method for manufacturing a solar cell of back junction type. The solar cell includes a semiconductor substrate having a main surface on one side and a main surface opposite thereto; a first conductivity-type semiconductor layer provided in a first region being a portion of the opposite main surface of the semiconductor substrate; and a second conductivity-type semiconductor layer provided in a second region being another portion of the opposite main surface of the semiconductor substrate. The method includes an intrinsic semiconductor layer formation step including forming an intrinsic semiconductor layer in the first region, the second region, and a boundary region of the opposite main surface of the semiconductor substrate, the boundary region being located between the first region and the second region; and a lift-off layer formation step including forming an insulating lift-off layer on the intrinsic semiconductor layer, and then removing a portion of the lift-off layer in the first region through patterning using an etching solution, thereby leaving the lift-off layer in the second region and the boundary region. The method further includes a first semiconductor layer material film formation step including forming a first conductivity-type semiconductor layer material film on a portion of the intrinsic semiconductor layer in the first region and on the lift-off layer in the second region and the boundary region; a first semiconductor layer formation step including removing a portion of the lift-off layer in the second region and removing a portion of the first conductivity-type semiconductor layer material film in the second region while leaving the lift-off layer in the boundary region unremoved to form a patterned first conductivity-type semiconductor layer in the first region and the boundary region; a second semiconductor layer material film formation step including forming a second conductivity-type semiconductor layer material film on the first conductivity-type semiconductor layer in the first region and the boundary region, and on a portion of the intrinsic semiconductor layer in the second region; and a second semiconductor layer formation step including forming the second conductivity-type semiconductor layer at least in the second region through patterning including removing at least a portion of the second conductivity-type semiconductor layer material film in the first region using an etching solution.

According to the present disclosure, it is possible to reduce performance degradation of a solar cell.

BRIEF DESCRIPTION OF THE DRAWINGS

FIG. 5A is a diagram illustrating a second semiconductor layer material film formation step in a solar cell manufacturing method according to the modification example of the embodiment.

DETAILED DESCRIPTION

Figure 1:
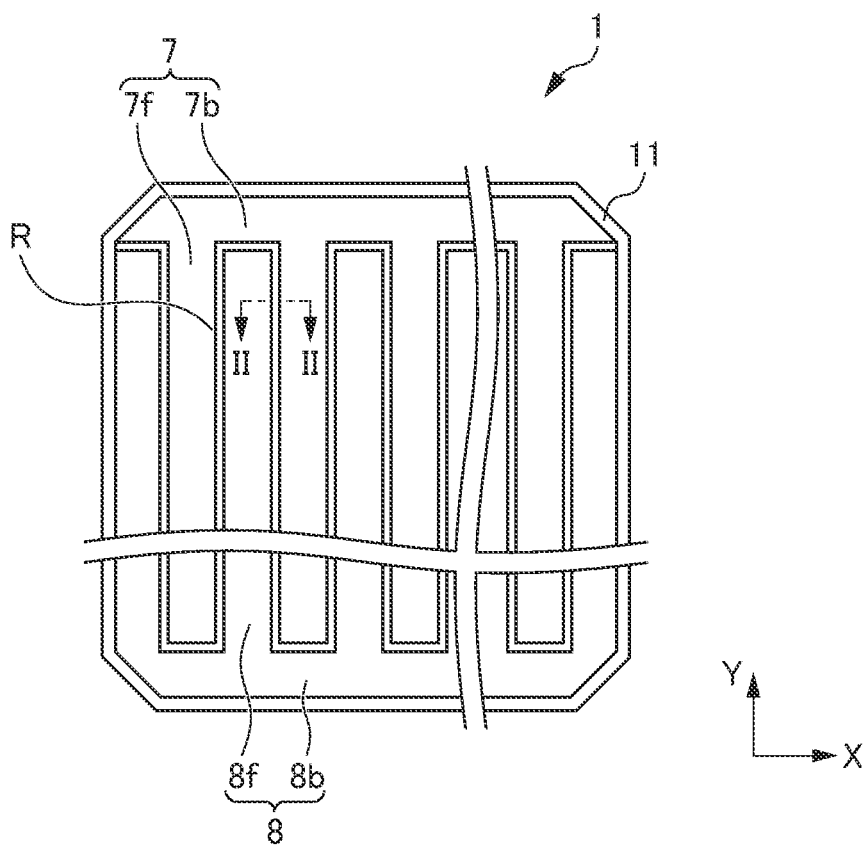
FIG. 1 is a back view of a solar cell according to an embodiment of the present disclosure.

The following describes an example of an embodiment of the present disclosure with reference to the accompanying drawings. Note that the same or corresponding elements are given the same reference numerals throughout the drawings. In some drawings, hatching, reference numerals, or the like are omitted for the sake of simplicity, which can be compensated for by referring to other drawings.

Solar Cell

FIG. 1 is a back view of a solar cell according to the present embodiment. A solar cell 1 shown in FIG. 1 is of back junction type. The solar cell 1 includes a semiconductor substrate 11 having two main surfaces, and one of the main surfaces of the semiconductor substrate 11 has a first region 7 and a second region 8.

The first region 7 has a so-called comb-like shape, and includes a plurality of fingers 7f, which are known as comb teeth, and a bus bar section 7b, which is known as a support of the comb teeth. The bus bar section 7b extends in a first direction (X direction) along one edge of the semiconductor substrate 11, and the fingers 7f extend from the bus bar section 7b in a second direction (Y direction) intersecting with the first direction (X direction). Likewise, the second region 8 has a so-called comb-like shape, and includes a plurality of fingers 8f, which are known as comb teeth, and a bus bar section 8b, which is known as a support of the comb teeth. The bus bar section 8b extends in the first direction (X direction) along another edge opposite to the one edge of the semiconductor substrate 11, and the fingers 8f extend from the bus bar section 8b in the second direction (Y direction). The fingers 7f and the fingers 8f are alternately provided in the first direction (X direction). Note that the first region 7 and the second region 8 may alternatively be in a stripe pattern.

The first region 7 and the second region 8 have a boundary region R therebetween.

Figure 2:
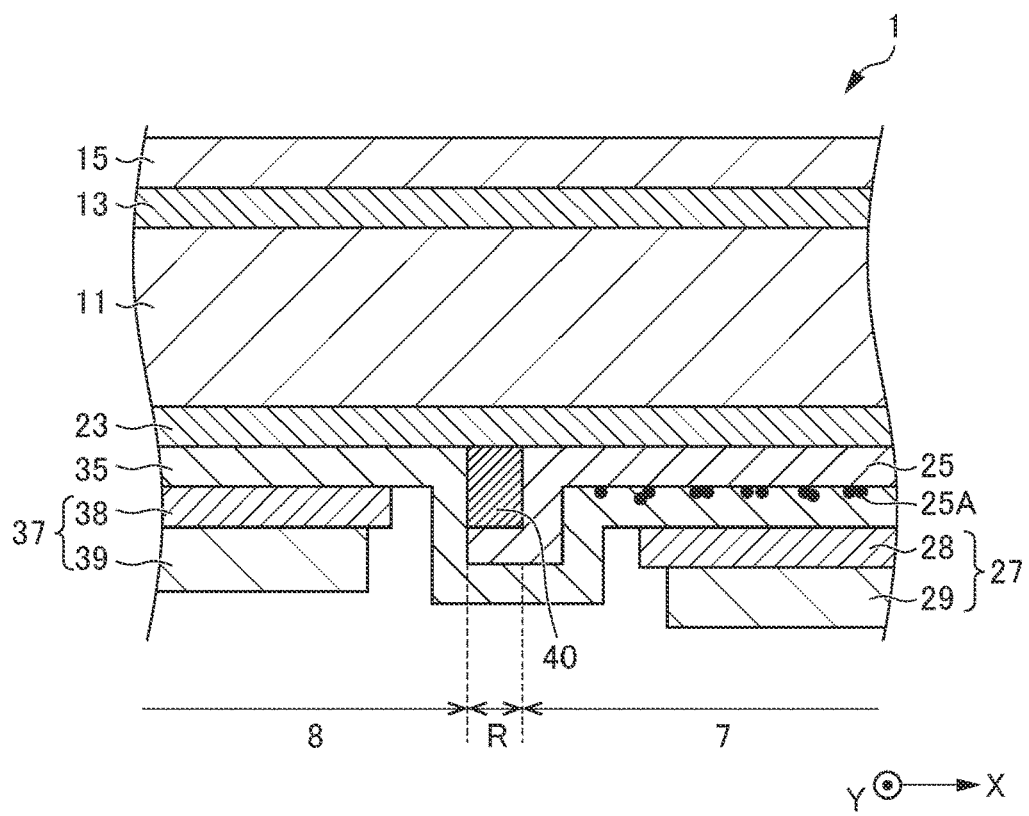
FIG. 2 is a cross-sectional view of the solar cell along line II-II in FIG. 1.

FIG. 2 is a cross-sectional view of the solar cell along line II-II in FIG. 1. As shown in FIG. 2, the solar cell 1 includes the semiconductor substrate 11, and an intrinsic semiconductor layer 13 and an optical tuning layer 15 that are stacked in order on a light receiving surface, which is one main surface on a light receiving side of the main surfaces of the semiconductor substrate 11. The solar cell 1 also includes an intrinsic semiconductor layer 23 provided on a back surface, which is an opposite main surface to the light receiving surface of the main surfaces of the semiconductor substrate 11; a first conductivity-type semiconductor layer 25 stacked on a portion of the intrinsic semiconductor layer 23 in a portion (first region 7) of the back surface of the semiconductor substrate 11; a second conductivity-type semiconductor layer 35 stacked on a portion of the intrinsic semiconductor layer 23 in another portion (second region 8) of the back surface of the semiconductor substrate 11 and on the first conductivity-type semiconductor layer 25 in the portion (first region 7) of the back surface of the semiconductor substrate 11; and an insulating layer 40 provided in the boundary region R between the first region 7 and the second region 8. The solar cell 1 further includes a first electrode layer 27 provided in the first region 7 and a second electrode layer 37 provided in the second region 8.

The semiconductor substrate 11 is formed from a crystalline silicon material such as single-crystal silicon or polycrystal silicon. The semiconductor substrate 11 is, for example, an n-type semiconductor substrate including a crystalline silicon material doped with an n-type dopant. The n-type dopant is, for example, phosphorus (P). The semiconductor substrate 11 functions as a photoelectric conversion substrate that generates photocarriers (electrons and holes) by absorbing light incident on the light receiving surface. The use of crystalline silicon as the material of the semiconductor substrate 11 helps keep dark current relatively low and produce relatively high power (stable power regardless of illumination intensity) even if the intensity of the incident light is low.

The back surface of the semiconductor substrate 11 may have a structure including fine pyramidal bumps, which is referred to as a textured structure. This structure increases the efficiency of collection of light that has passed through the light receiving surface without being absorbed by the semiconductor substrate 11. The light receiving surface of the semiconductor substrate 11 may have a structure including fine pyramidal bumps, which is referred to as a textured structure. This structure reduces reflection of light incident on the light receiving surface and improves the light confinement effect in the semiconductor substrate 11.

The intrinsic semiconductor layer 13 is provided on the light receiving surface of the semiconductor substrate 11. The intrinsic semiconductor layer 23 is continuous across the first region 7, the boundary region R, and the second region 8 of the back surface of the semiconductor substrate 11. The intrinsic semiconductor layers 13 and 23 are formed from, for example, a material containing intrinsic (i-type) amorphous silicon as a main component. The intrinsic semiconductor layers 13 and 23 function as so-called passivation layers and suppress recombination of carriers generated in the semiconductor substrate 11 to increase the carrier collection efficiency.

The optical tuning layer 15 is provided on the intrinsic semiconductor layer 13 on the light receiving surface of the semiconductor substrate 11. The optical tuning layer 15 functions as an antireflection layer for preventing reflection of incident light and functions as a protective layer for protecting the light receiving surface of the semiconductor substrate 11 and the intrinsic semiconductor layer 13. The optical tuning layer 15 is formed from, for example, an insulator material such as silicon oxide (SiO), silicon nitride (SiN), or a composite thereof such as silicon oxynitride (SiON).

The first conductivity-type semiconductor layer 25 is continuous across the first region 7 and the boundary region R of the back surface of the semiconductor substrate 11. Specifically, the first conductivity-type semiconductor layer 25 is provided on a portion of the intrinsic semiconductor layer 23 in the first region 7 and on the insulating layer 40 provided on a portion of the intrinsic semiconductor layer 23 in the boundary region R. The first conductivity-type semiconductor layer 25 is formed from, for example, an amorphous silicon material. The first conductivity-type semiconductor layer 25 is, for example, an n-type semiconductor layer including an amorphous silicon material doped with an n-type dopant (for example, phosphorus (P) as mentioned above).

The second conductivity-type semiconductor layer 35 is continuous across the first region 7, the boundary region R, and the second region 8 of the back surface of the semiconductor substrate 11. Specifically, the second conductivity-type semiconductor layer 35 is provided on the first conductivity-type semiconductor layer 25 in the first region 7 and the boundary region R, and on a portion of the intrinsic semiconductor layer 23 in the second region 8. The second conductivity-type semiconductor layer 35 is formed from, for example, an amorphous silicon material. The second conductivity-type semiconductor layer 35 is, for example, a p-type semiconductor layer including an amorphous silicon material doped with a p-type dopant. The p-type dopant is, for example, boron (B).

Preferably, the second conductivity-type semiconductor layer 35 has a film thickness of 3.5 nm or more. The film thickness of the second conductivity-type semiconductor layer 35 refers to a dimension in a stacking direction of the layers such as the first conductivity-type semiconductor layer 25 and the second conductivity-type semiconductor layer 35, which in other words is a dimension in a direction intersecting with the first direction (X direction) and the second direction (Y direction). Preferably, in the first region, an outer surface of the first conductivity-type semiconductor layer 25 has particles 25A adhering thereto, which originate from the first conductivity-type semiconductor layer 25 (detailed description will be given below).

Note that the first conductivity-type semiconductor layer 25 may alternatively be a p-type semiconductor layer, and the second conductivity-type semiconductor layer 35 may alternatively be an n-type semiconductor layer. In this case, the semiconductor substrate 11 may alternatively be a p-type semiconductor substrate including a crystalline silicon material doped with a p-type dopant (for example, boron (B) as mentioned above).

The insulating layer 40 is provided in the boundary region R. The insulating layer 40 on the intrinsic semiconductor layer 23 is located between a portion of the first conductivity-type semiconductor layer 25 in the first region 7 and a portion of the intrinsic semiconductor layer 23 in the second region 8. The insulating layer 40 is formed from a lift-off layer material described below. The lift-off layer material is, for example, an insulating material such as silicon oxide (SiO), silicon nitride (SiN), or a composite thereof such as silicon oxynitride (SiON). Hereinafter, the insulating layer 40 is also referred to as a lift-off layer.

It is necessary that the insulating layer 40 have a film thickness of from tens of nm to hundreds of nm, and a width of 100 μm or less. The film thickness of the insulating layer 40 refers to a dimension in the stacking direction of the layers such as the first conductivity-type semiconductor layer 25 and the second conductivity-type semiconductor layer 35, which in other words is a dimension in the direction intersecting with the first direction (X direction) and the second direction (Y direction). The width of the insulating layer 40 refers to a dimension in a direction extending from the second conductivity-type semiconductor layer 35 toward the first conductivity-type semiconductor layer 25 and in parallel to the first direction (X direction).

In other words, in the first region 7, the first conductivity-type semiconductor layer 25 and the second conductivity-type semiconductor layer 35 are stacked in order on the intrinsic semiconductor layer 23 on the back surface of the semiconductor substrate 11. In the second region 8, the second conductivity-type semiconductor layer 35 is stacked on the intrinsic semiconductor layer 23 on the back surface of the semiconductor substrate 11. In the boundary region R, the insulating layer 40, the first conductivity-type semiconductor layer 25, and the second conductivity-type semiconductor layer 35 are stacked in order on the intrinsic semiconductor layer 23 on the back surface of the semiconductor substrate 11.

The first electrode layer 27 is provided on a portion of the second conductivity-type semiconductor layer 35 in the first region 7, and the second electrode layer 37 is provided on a portion of the second conductivity-type semiconductor layer 35 in the second region 8. The first electrode layer 27 has a transparent electrode layer 28 and a metal electrode layer 29 that are stacked in order on the second conductivity-type semiconductor layer 35. The second electrode layer 37 has a transparent electrode layer 38 and a metal electrode layer 39 that are stacked in order on the second conductivity-type semiconductor layer 35. The transparent electrode layers 28 and 38 are formed from a transparent electrically-conductive material. Examples of transparent electrically-conductive materials include indium tin oxide (ITO, a complex oxide of indium oxide and tin oxide) and zinc oxide (ZnO). The metal electrode layers 29 and 39 are formed from an electrically-conductive paste material containing metal powder such as silver.

Solar Cell Manufacturing Method

Figure 3A:
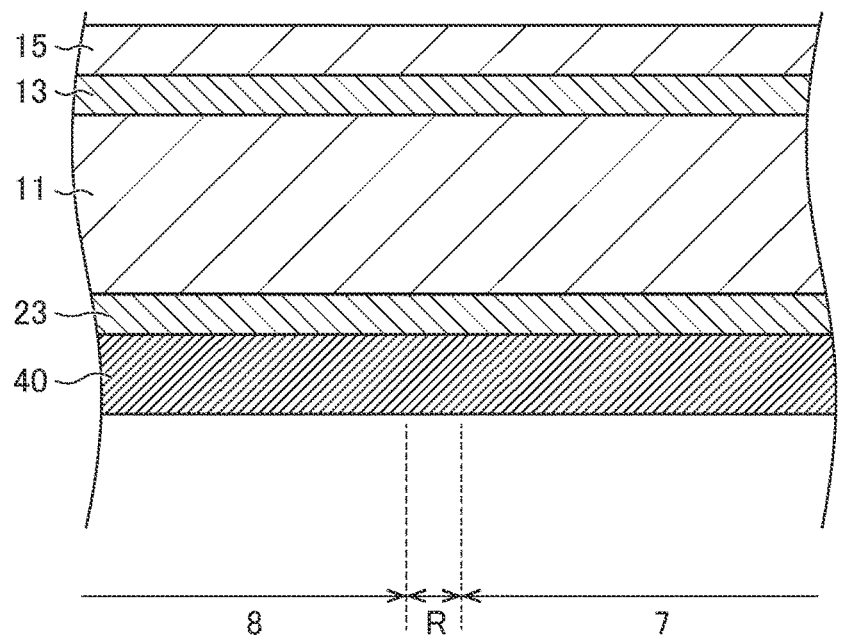
FIG. 3A is a diagram illustrating an intrinsic semiconductor layer formation step and a lift-off layer formation step in a solar cell manufacturing method according to the embodiment.
Figure 3B:
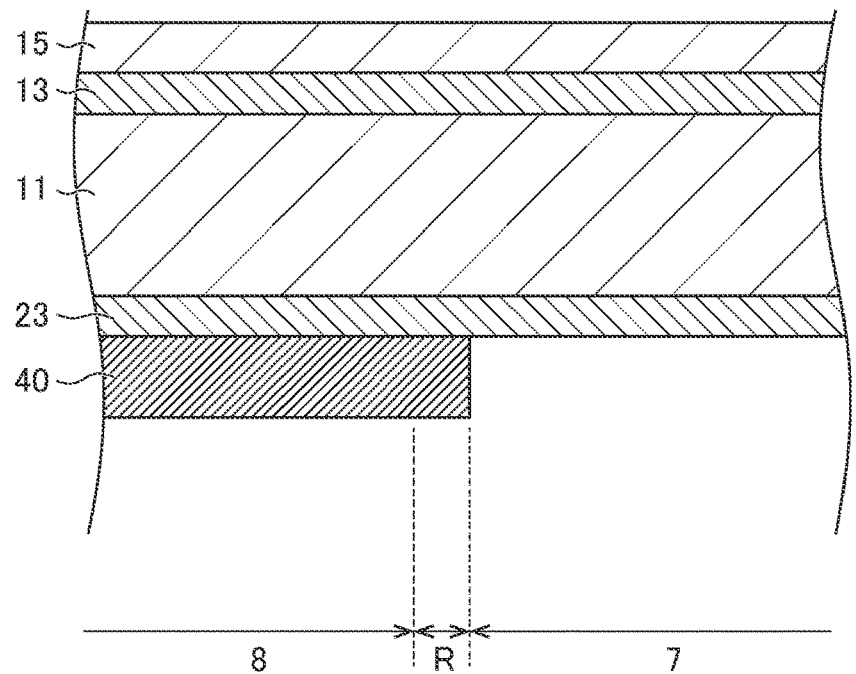
FIG. 3B is a diagram illustrating the lift-off layer formation step in the solar cell manufacturing method according to the embodiment.
Figure 3C:
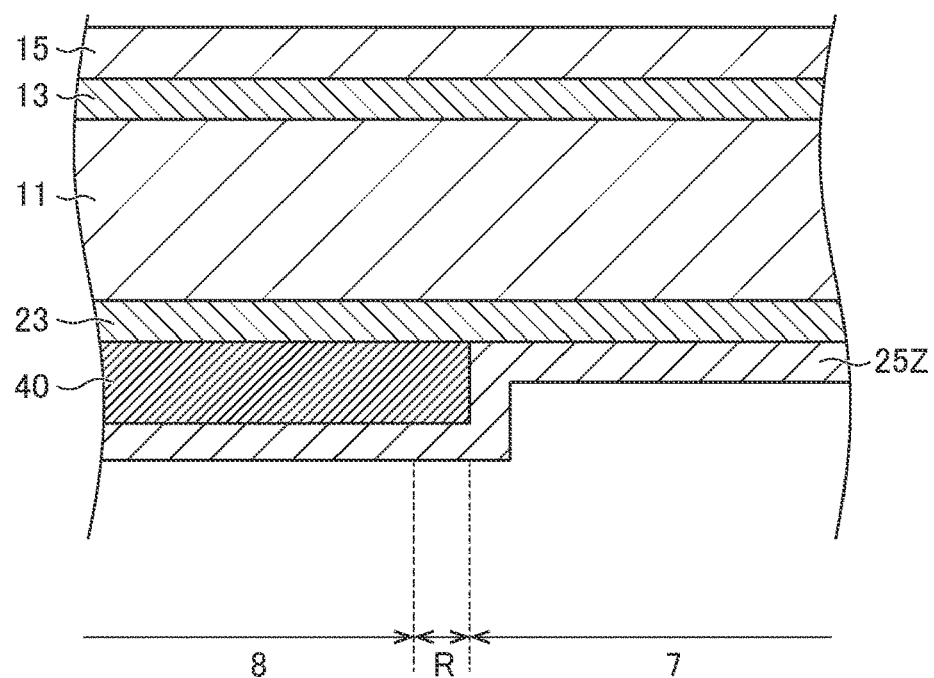
FIG. 3C is a diagram illustrating a first semiconductor layer material film formation step in the solar cell manufacturing method according to the embodiment.
Figure 3D:
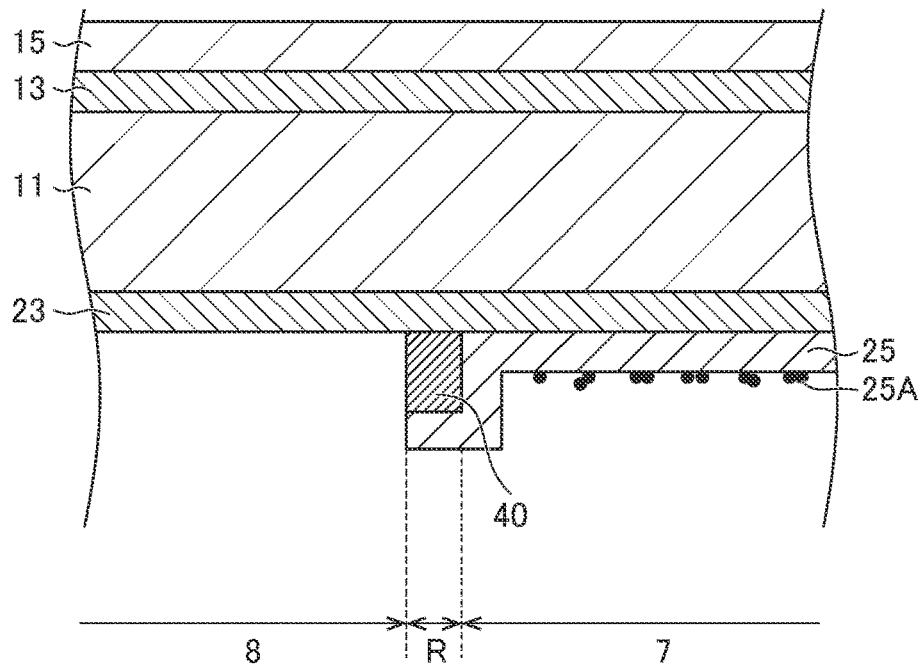
FIG. 3D is a diagram illustrating a first semiconductor layer formation step in the solar cell manufacturing method according to the embodiment.
Figure 3E:
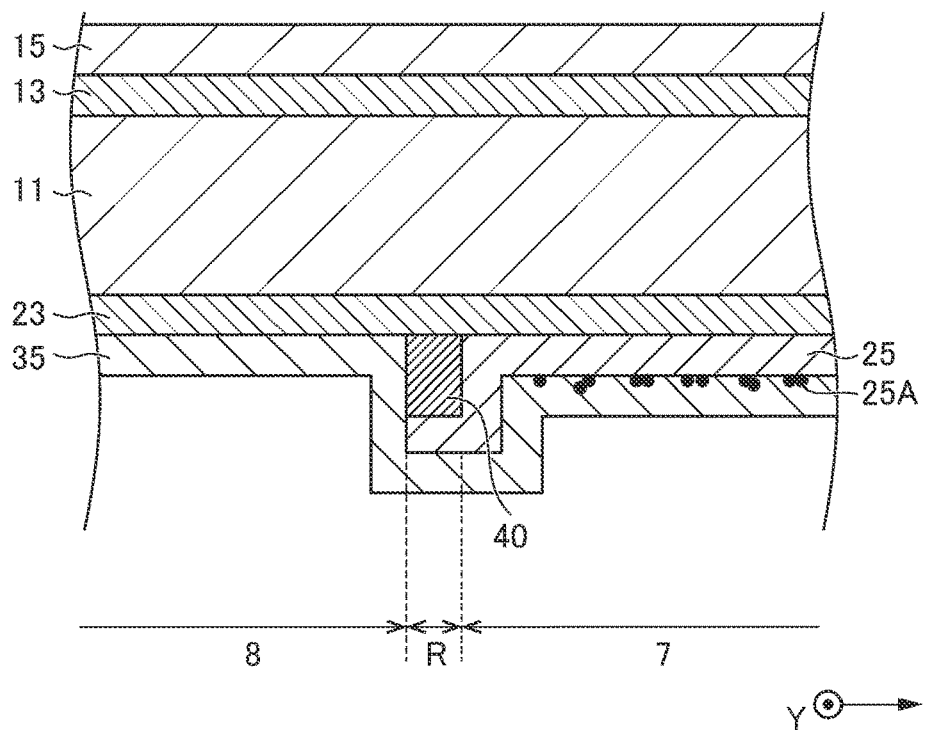
FIG. 3E is a diagram illustrating a second semiconductor layer formation step in the solar cell manufacturing method according to the embodiment.

Hereinafter, a method for manufacturing the solar cell 1 according to the present embodiment shown in FIGS. 1 and 2 will be described with reference to FIGS. 3A to 3E. FIG. 3A is a diagram illustrating an intrinsic semiconductor layer formation step and a lift-off layer formation step in the solar cell manufacturing method according to the present embodiment. FIG. 3B is a diagram illustrating the lift-off layer formation step in the solar cell manufacturing method according to the present embodiment. FIG. 3C is a diagram illustrating a first semiconductor layer material film formation step in the solar cell manufacturing method according to the present embodiment. FIG. 3D is a diagram illustrating a first semiconductor layer formation step in the solar cell manufacturing method according to the present embodiment. FIG. 3E is a diagram illustrating a second semiconductor layer formation step in the solar cell manufacturing method according to the present embodiment.

First, as shown in FIG. 3A, the intrinsic semiconductor layer 23 is stacked (film formation) on the entire back surface of the semiconductor substrate 11, that is, in the first region 7, the boundary region R, and the second region 8, by a chemical vapor deposition (CVD) method, for example (intrinsic semiconductor layer formation step). Furthermore, the intrinsic semiconductor layer 13 and the optical tuning layer 15 are stacked (film formation) on the entire light receiving surface of the semiconductor substrate 11 by a CVD method, for example.

Next, the lift-off layer (insulating layer) 40 is stacked (film formation) over the entire back surface of the semiconductor substrate 11, that is, on the entire surface of the intrinsic semiconductor layer 23 by a CVD method, for example (lift-off layer formation step).

Next, as shown in FIG. 3B, a portion of the lift-off layer 40 in the first region 7 of the back surface of the semiconductor substrate 11 is removed through patterning using an etching solution, thereby leaving the lift-off layer 40 in the second region 8 and the boundary region R (lift-off layer formation step). Hydrofluoric acid or a mixture of hydrofluoric acid and another acid, for example, is used as the etching solution for the lift-off layer 40.

Next, as shown in FIG. 3C, a first conductivity-type semiconductor layer material film 25Z is stacked (film formation) over the entire back surface of the semiconductor substrate 11, that is, on a portion of the intrinsic semiconductor layer 23 in the first region 7 and on the lift-off layer 40 in the second region 8 and the boundary region R (first semiconductor layer material film formation step).

Next, as shown in FIG. 3D, the first conductivity-type semiconductor layer 25 is formed in the first region 7 and the boundary region R through patterning by a lift-off method using the lift-off layer 40. The patterning includes removing a portion of the first conductivity-type semiconductor layer material film 25Z in the second region 8 of the back surface of the semiconductor substrate 11 while leaving the lift-off layer 40 in the boundary region R (first semiconductor layer formation step).

Specifically, the first conductivity-type semiconductor layer 25 is formed in the first region 7 and the boundary region R by etching including cutting (removing) a portion of the lift-off layer 40 in the second region 8 of the back surface of the semiconductor substrate 11 using an etching solution, and thus removing a portion of the first conductivity-type semiconductor layer material film 25Z on the lift-off layer 40 while leaving the lift-off layer 40 in the boundary region R. An acidic solution such as hydrofluoric acid, for example, is used as the etching solution for the lift-off layer 40.

In the lift-off process, the particles 25A originating from the removed portion of the first conductivity-type semiconductor layer in the second region 8 adhere to the outer surface of the first conductivity-type semiconductor layer 25 in the first region 7.

Next, as shown in FIG. 3E, the second conductivity-type semiconductor layer 35 is formed over the entire back surface of the semiconductor substrate 11, that is, on the first conductivity-type semiconductor layer 25 in the first region 7 and the boundary region R, and on a portion of the intrinsic semiconductor layer 23 in the second region 8 by a CVD method, for example (second semiconductor layer formation step).

Next, the first electrode layer 27 and the second electrode layer 37 are formed on the back side of the semiconductor substrate 11 (electrode layer formation step). Specifically, a transparent electrode layer material film is stacked (film formation) over the entire back surface of the semiconductor substrate 11 by, for example, a physical vapor deposition (PVD) method such as a sputtering method. Thereafter, the transparent electrode layers 28 and 38 are formed through patterning including removing a portion of the transparent electrode layer material film by, for example, an etching method using an etching solution. Hydrochloric acid or an aqueous ferric chloride solution, for example, is used as the etching solution for the transparent electrode layer material film. Thereafter, the metal electrode layer 29 is formed on the transparent electrode layer 28 and the metal electrode layer 39 is formed on the transparent electrode layer 38 by, for example, a pattern printing method or a coating method to complete the first electrode layer 27 and the second electrode layer 37.

Through the above-described steps, the solar cell 1 of back junction type according to the present embodiment shown in FIGS. 1 and 2 is obtained.

As described above, in the solar cell 1 and the solar cell manufacturing method according to the present embodiment, the second conductivity-type semiconductor layer 35 is simply formed over the entire back surface of the semiconductor substrate 11 after the patterning for the first conductivity-type semiconductor layer 25. Thus, it is possible to achieve simplification, a reduction in time, and a reduction in cost of the manufacturing process. In the solar cell manufacturing method according to the present embodiment, the main surfaces of the semiconductor substrate 11 are not exposed during the manufacturing process, in particular, during the formation of the first conductivity-type semiconductor layer 25 and the second conductivity-type semiconductor layer 35. Thus, it is possible to maintain a long lifetime of the solar cell.

In the solar cell 1 and the solar cell manufacturing method according to the present embodiment, the insulating layer 40 is provided between a portion of the first conductivity-type semiconductor layer 25 in the first region 7 and a portion of the second conductivity-type semiconductor layer 35 in the second region 8, in the vicinity of the back surface of the semiconductor substrate 11. The semiconductor substrate 11 is therefore kept from undergoing carrier recombination in an area in the vicinity of the boundary between the portion of the first conductivity-type semiconductor layer 25 in the first region 7 and the portion of the second conductivity-type semiconductor layer 35 in the second region 8. Thus, it is possible to reduce performance degradation of the solar cell.

Furthermore, in the solar cell manufacturing method according to the present embodiment, the insulating layer 40 is formed by leaving a portion of the lift-off layer 40, which is used in the first semiconductor layer formation step. Thus, it is possible to achieve simplification, a reduction in time, and a reduction in cost of the manufacturing process.

The present inventor(s) has found that in a configuration in which the back surface of the semiconductor substrate 11 has a textured structure, the insulating layer is removed in dips of the textured structure but remains on bumps of the textured structure. In the solar cell 1 and the solar cell manufacturing method according to the present embodiment, the back surface of the semiconductor substrate 11 has a textured structure. Thus, it is possible to leave the insulating layer (lift-off layer) 40 in the boundary region R of the back surface of the semiconductor substrate 11 in the first semiconductor layer formation step.

Note here that in order to prevent performance degradation of the second conductivity-type semiconductor layer (for example, p-type semiconductor layer) 35 in the second region 8, it is necessary that the second conductivity-type semiconductor layer 35 have a large thickness (for example, 3.5 nm or more). However, increasing the film thickness of the second conductivity-type semiconductor layer 35 leads to a decrease in tunneling efficiency between the first conductivity-type semiconductor layer (for example, n-type semiconductor layer) 25 and the second conductivity-type semiconductor layer (for example, p-type semiconductor layer) 35 in the first region 7, resulting in an increase in resistance in the film thickness direction.

However, the solar cell manufacturing method according to the present embodiment employs the lift-off method in the first semiconductor layer formation step. In the lift-off process, the particles 25A originating from the removed portion of the first conductivity-type semiconductor layer in the second region 8 adhere to the outer surface of the first conductivity-type semiconductor layer 25 in the first region 7. Since the particles 25A originating from the first conductivity-type semiconductor layer are present between the first conductivity-type semiconductor layer 25 and the second conductivity-type semiconductor layer 35 in the first region 7, tunneling conduction improves between the first conductivity-type semiconductor layer (for example, n-type semiconductor layer) 25 and the second conductivity-type semiconductor layer (for example, p-type semiconductor layer) 35 in the first region 7, suppressing increases in interface resistance therebetween and in resistance in the film thickness direction. As a result, the FF characteristics of the solar cell improve. As described above, the use of the lift-off method in the first semiconductor layer formation step and the second conductivity-type semiconductor layer 35 having a film thickness of 3.5 nm or more prevent performance degradation of the second conductivity-type semiconductor layer (for example, p-type semiconductor layer) 35 in the second region 8 and suppress an increase in resistance in the film thickness direction of the second conductivity-type semiconductor layer (for example, p-type semiconductor layer) 35 in the first region 7. As a result, it is possible to achieve a high-performance solar cell.

MODIFICATION EXAMPLE

Figure 4:
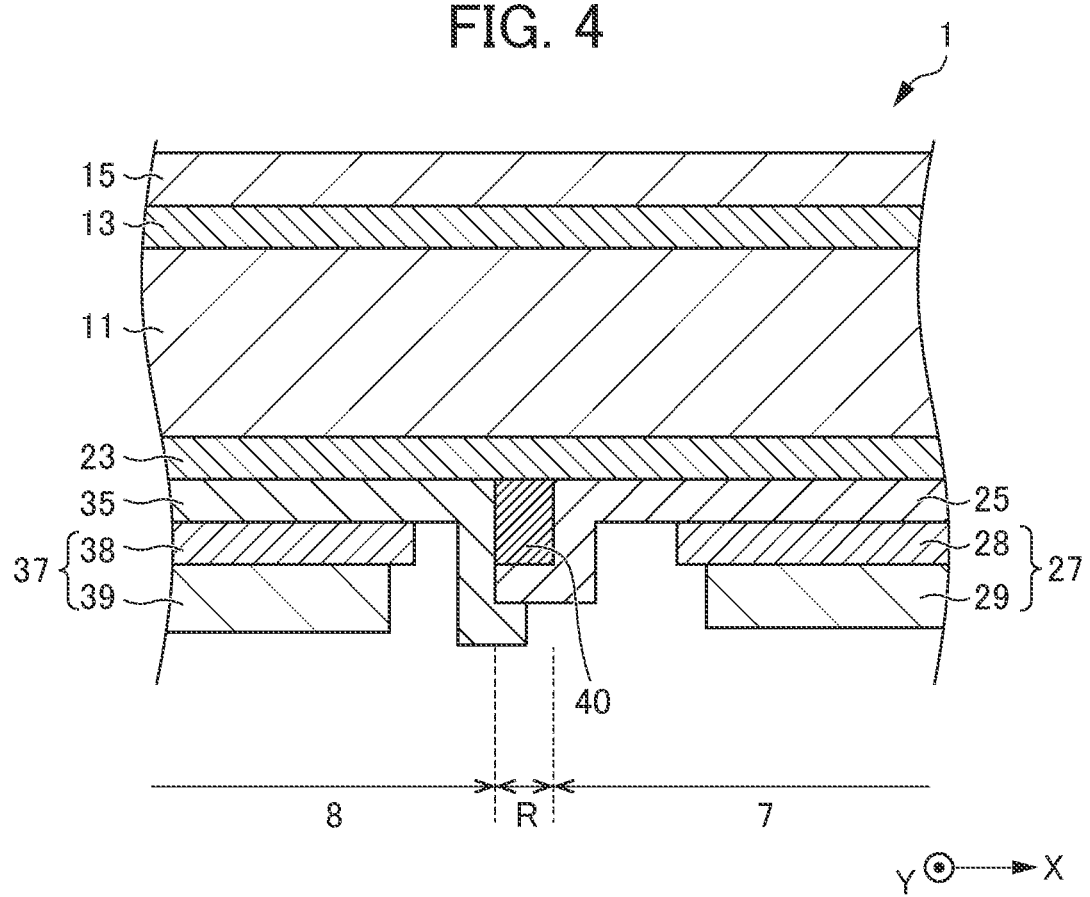
FIG. 4 is a cross-sectional view of a solar cell according to a modification example of the embodiment and corresponds to the cross-sectional view taken along line II-II in FIG. 1.

FIG. 4 is a cross-sectional view of a solar cell according to a modification example of the present embodiment and corresponds to the cross-sectional view taken along line II-II in FIG. 1. As shown in FIG. 4, the second conductivity-type semiconductor layer 35 in the solar cell 1 shown in FIG. 2 may be patterned so as not to reside on the first conductivity-type semiconductor layer 25 in a solar cell 1 according to the present modification example.

Specifically, the solar cell 1 according to the modification example may have the following configuration. That is, in the first region 7, the first conductivity-type semiconductor layer 25 is stacked on the intrinsic semiconductor layer 23 on the back surface of the semiconductor substrate 11. In the second region 8, the second conductivity-type semiconductor layer 35 is stacked on the intrinsic semiconductor layer 23 on the back surface of the semiconductor substrate 11. In the boundary region R, the insulating layer 40 and the first conductivity-type semiconductor layer 25 are stacked in order on the intrinsic semiconductor layer 23 on the back surface of the semiconductor substrate 11.

Figure 5B:
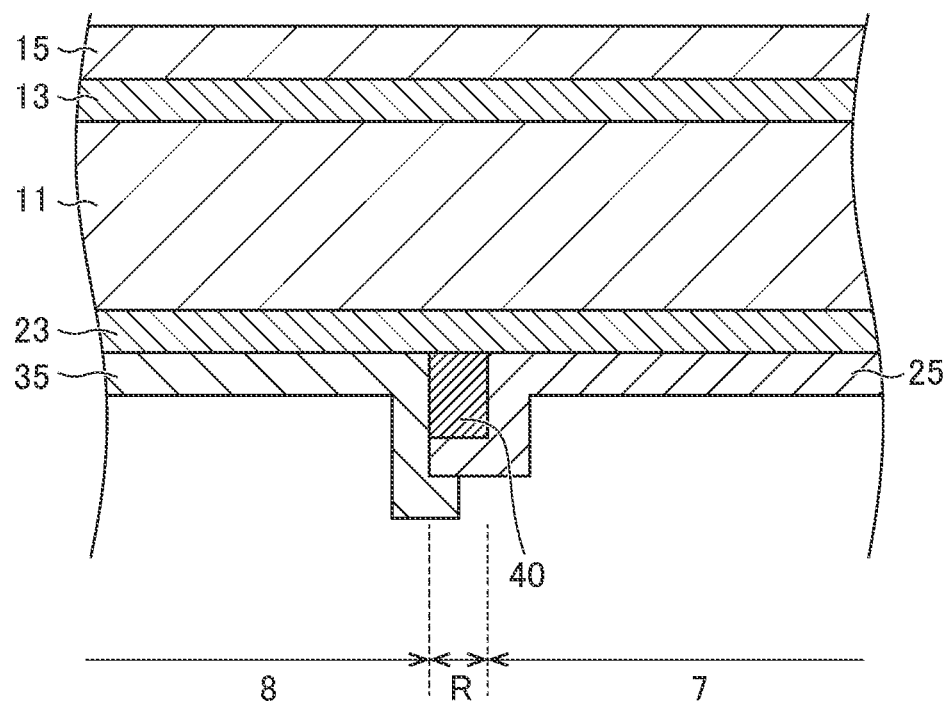
FIG. 5B is a diagram illustrating a second semiconductor layer formation step in the solar cell manufacturing method according to the modification example of the embodiment.

A method for manufacturing the solar cell according to the present modification example may include a second semiconductor layer material film formation step shown in FIG. 5A and a second semiconductor layer formation step shown in FIG. 5B instead of the second semiconductor layer formation step shown in FIG. 3E in the solar cell manufacturing method shown in FIGS. 3A to 3E.

Specifically, in the solar cell manufacturing method according to the modification example, the first semiconductor formation step shown in FIG. 3D may be followed by the steps described below. That is, as shown in FIG. 5A, a second conductivity-type semiconductor layer material film 35Z is formed on a portion of the intrinsic semiconductor layer 23 in the second region 8, and on the first conductivity-type semiconductor layer 25 in the first region 7 and the boundary region R by a CVD method, for example (second semiconductor layer material film formation step). Thereafter, as shown in FIG. 5B, the second conductivity-type semiconductor layer 35 is formed at least in the second region 8 through patterning by etching including cutting (removing) at least a portion of the second conductivity-type semiconductor layer material film 35Z in the first region 7 using an etching solution (second semiconductor layer formation step).

Although an embodiment of the present disclosure has been described above, the above-described embodiment is not intended to limit the present disclosure and may be altered or modified in various ways. For example, for the above-described embodiment, the method for manufacturing the solar cell 1 of heterojunction type as shown in FIG. 2 is mentioned by way of example. However, the features of the present disclosure are applicable to manufacturing methods of various solar cells such as homojunction type solar cells as well as those of heterojunction type solar cells.

Furthermore, for the above-described embodiment, the solar cell having a crystalline silicon substrate is mentioned by way of example. However, the present disclosure is not limited as such. The solar cell may have, for example, a gallium arsenide (GaAs) substrate.

What is claimed is:

1. A solar cell of back junction type comprising:
    a semiconductor substrate having a main surface on one side and an opposite main surface opposite thereto;
    an intrinsic semiconductor layer on the opposite main surface;
    an insulating layer on the intrinsic semiconductor layer;
    a first conductivity-type semiconductor layer provided in a first region which is a portion of the opposite main surface of the semiconductor substrate; and
    a second conductivity-type semiconductor layer provided on the first conductivity-type semiconductor layer in the first region and extending to a second region which is another portion of the opposite main surface of the semiconductor substrate, wherein
    in the first region, an outer surface of the first conductivity-type semiconductor layer has particles adhering thereto, the particles having the same composition as the first conductivity-type semiconductor layer,
    in the first region, the first conductivity-type semiconductor layer and the second conductivity-type semiconductor layer are stacked in order on the intrinsic semiconductor layer on the opposite main surface of the semiconductor substrate,
    in the second region, the second conductivity-type semiconductor layer is stacked on the intrinsic semiconductor layer on the opposite main surface of the semiconductor substrate,
    in a boundary region between the first region and the second region, the insulating layer, the first conductivity-type semiconductor layer, and the second conductivity-type semiconductor layer are stacked in order on the intrinsic semiconductor layer on the opposite main surface of the semiconductor substrate,
    the intrinsic semiconductor layer is continuous across the first region, the boundary region, and the second region,
    the first conductivity-type semiconductor layer is continuous across the first region and the boundary region,
    the second conductivity-type semiconductor layer is continuous across the first region, the boundary region, and the second region, and
    the insulating layer is located between a portion of the first conductivity-type semiconductor layer in the first region and a portion of the second conductivity-type semiconductor layer in the second region.

2. The solar cell according to claim 1, wherein the opposite main surface of the semiconductor substrate has a textured structure.

3. The solar cell according to claim 1, wherein the second conductivity-type semiconductor layer has a film thickness of 3.5 nm or more.

4. The solar cell according to claim 2, wherein the second conductivity-type semiconductor layer has a film thickness of 3.5 nm or more.

* * * * *